(12) United States Patent
Abadie et al.

(10) Patent No.: US 10,768,216 B2
(45) Date of Patent: Sep. 8, 2020

(54) TEST ARRANGEMENT AND TEST METHOD

(71) Applicant: Rohde & Schwarz GmbH & Co. KG, Munich (DE)

(72) Inventors: Vincent Abadie, Höhenschäftlarn (DE); Corbett Rowell, Munich (DE); Edwin Menzel, Munich (DE); Axel Meier, Wolnzach (DE); Niels Petrovic, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 295 days.

(21) Appl. No.: 15/921,912

(22) Filed: Mar. 15, 2018

(65) Prior Publication Data

US 2019/0285678 A1  Sep. 19, 2019

(51) Int. Cl.
*G01R 29/10* (2006.01)
*G01R 29/08* (2006.01)
*H04W 24/08* (2009.01)
*H04B 17/00* (2015.01)

(52) U.S. Cl.
CPC ......... *G01R 29/10* (2013.01); *G01R 29/0821* (2013.01); *G01R 29/0878* (2013.01); *H04B 17/0085* (2013.01); *H04W 24/08* (2013.01)

(58) Field of Classification Search
CPC .. G01R 29/10; G01R 29/105; G01R 29/0864; G01R 29/0871; G01R 29/0878; G01R 29/0892; H04B 17/0085; H04W 24/08
See application file for complete search history.

(56) References Cited

U.S. PATENT DOCUMENTS

| | | | |
|---|---|---|---|
| 8,090,052 B2 | 1/2012 | Elmala et al. | |
| 8,880,002 B2 | 11/2014 | Falck et al. | |
| 8,954,014 B2 | 2/2015 | Kyösti et al. | |
| 9,906,315 B1* | 2/2018 | Bartko | H04B 17/102 |
| 2012/0071107 A1 | 3/2012 | Falck et al. | |
| 2012/0244818 A1 | 9/2012 | Kyösti et al. | |
| 2018/0287721 A1* | 10/2018 | Vikstedt | H04B 17/16 |
| 2019/0393968 A1* | 12/2019 | Ioffe | H04B 17/101 |

FOREIGN PATENT DOCUMENTS

| | | |
|---|---|---|
| EP | 2438699 A1 | 4/2012 |
| EP | 2494720 A1 | 9/2012 |
| WO | 2010139840 A1 | 12/2010 |
| WO | 2011051537 A1 | 5/2011 |

* cited by examiner

*Primary Examiner* — Robert Karacsony
(74) *Attorney, Agent, or Firm* — Westman, Champlin & Koehler, P.A.

(57) ABSTRACT

The present invention provides a test arrangement and test method for testing a wireless device under test. A first antenna may be arranged at a first distance from the device under test, and a second antenna may be arranged at a second distance from the device under test. In particular, the second antenna may be arranged closer to the device under test and the first antenna. Physical parameters characterizing the transmission properties between the individual antenna and the device under test are determined for the first and the second antenna. Test of the device under test is performed employing the second antenna, wherein the signals are rescaled based.

16 Claims, 2 Drawing Sheets

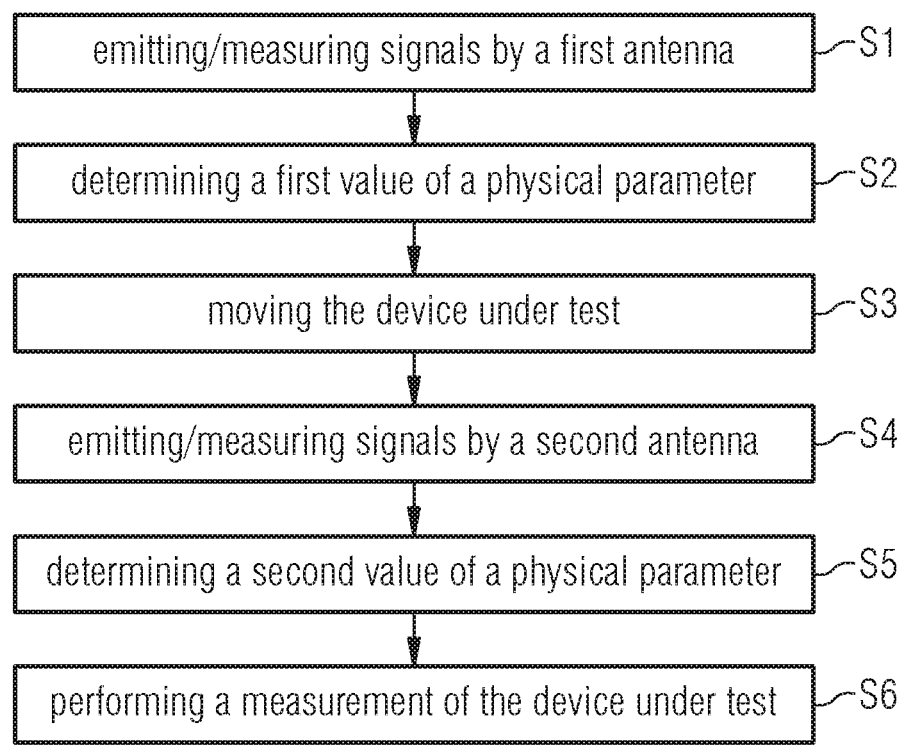

TEST ARRANGEMENT AND TEST METHOD

TECHNICAL FIELD

The present invention relates to a test arrangement for testing a device under test. The present invention further relates to a respective test method.

BACKGROUND

Although applicable in principal to any wireless test system, the present invention and its underlying problem will be hereinafter described in combination with testing of wireless devices.

The use of wireless communication systems for communication between electronic device increases continually with the advance of high-speed wireless data communications.

During development or production of devices for such communication systems it is necessary to thoroughly test the devices for compliance with communication standards and legal regulations.

Usually the respective wireless communication standards and legal regulations will determine the circumstances under which a test must be performed.

For example, usually the compliance tests of such devices require far-field measurements of the respective devices. However, far-field measurements usually require large measurement chambers with sizes of up to 100 s of meters or complex and costly arrangements, like e.g. Compact Antenna Test Ranges or CATRs. Furthermore, far field measurements require higher output power of wireless signals for communication between a measurement device and the device under test.

Against this background, the problem addressed by the present invention is to provide an efficient test equipment for wireless devices.

SUMMARY

The present invention solves this object by a test arrangement with the features of claim 1 and a test method with the features of claim 11.

According to a first aspect, a test arrangement for testing a device under test is provided. The test arrangement comprises a first antenna, a second antenna a mechanical positioning structure and a measurement device. The first antenna is adapted to emit signals to the device under test. Additionally or alternatively, the first antenna may be adapted to measure signals emitted by the device under test to the first antenna. The second antenna it is adapted to emit signals to the device under test. Additionally or alternatively, the second antenna may be adapted to measure signals emitted by the device under test to the second antenna. The mechanical positioning structure is adapted to carry the device under test. The mechanical positioning structure further may controllably moves the device under test. The measurement device is adapted to determine a first value of a physical parameter on a first communication link between the device under test and the first antenna. Further, the measurement device may determining a second value of a physical parameter on a second communication link between the device under test and the second antenna. The measurement device may further perform, a measurement of the device under test based on the determined first value and the determined second value. In particular, the device under test is moved to a first position for determining the first value and the device under test is moved to a second position for determining the second value.

According to a second aspect, a test method for testing a device under test is provided. The test method comprises emitting signals by a first antenna to the device under test or measuring signals emitted by the device under test to the first antenna. The test method further comprises emitting signals by a second antenna for to the device under test or measuring signals emitted by the device under test to the second antenna. Further, the test method controllably moves the device under test by a mechanical positioning structure that carries the device under test. The test method further determines a first value of a physical parameter on a first communication link between the device under test and the first antenna by a measurement device, and determines a second value of a physical parameter on a second communication link between the device under test and the second antenna. Further, the test method performs a measurement of the device under test based on the determined first value and the determined second value by the measurement device. In particular, the device under test is moved to a first position for determining the first value and the device under test is moved to a second position for determining the second value.

As explained above, compliance tests of a wireless communication device in many cases require a far field measurement. However, far field measurements not only require a large scale test arrangement but also high transmission power for transmitting radio frequency signals between the device under test and the test the device. Generating high power signals for testing wireless devices under far field conditions requires complex and expensive test devices. Furthermore, in some conditions it is even not possible to provide the required high power test signals.

The present invention therefore tries to avoid or at least minimize the need of high power radio frequency signals for testing a wireless device. For this purpose, the present invention introduces a second communication link between the device under test and an antenna having a reduced distance. Accordingly, such a reduced distance requires lower power of the radio frequency signals between the device under test and the test the system. Accordingly, a test of a device under test can be performed based on test signals having a reduced power. Moreover, by reducing the distance between the device under test and the antenna of the test device, the space of the test arrangement can be reduced. Hence, it may be even possible to perform the required test indoor, e.g. in a test chamber.

In order to make the test results performed by means of the second antenna comparable with a test configuration based on a test condition requiring the first antenna, radio-frequency conditions in the communication link between the device under test and the second antenna may be scaled in such a manner that the radio-frequency conditions correspond to a test configuration with the first antenna. For example, the radio-frequency signals between the device under test and the first antenna may be analyzed and based on this analysis, the test settings of a radio-frequency link between the device under test and the second antenna may be adapted in such a manner that the test conditions can be compared with a radio-frequency link between the first antenna and the device under test. For example, a transmission power of radio frequency signal may be adapted accordingly, or another parameter may be set in order to achieve desired values, e.g. an Error Vector Magnitude (EVM) or the like. However, it is understood, that any other parameter may be also used as reference for scaling the settings of testing the device under test by means of the second antenna.

In an antenna is arranged in a far field of the device under test, high transmission power may be required for obtaining a desired physical parameter at the device under test. Accordingly, an antenna, e.g. the first antenna, has to be provided with high power in order to perform a desired test scenario. Therefore, it is an idea of the present invention to arrange a further, second antenna closer to the device under test. Accordingly, lower power has to be provided to the second antenna in order to achieve a same result at the device under test. Furthermore, a first antenna which is arranged in a far field distance may only receive week signals emitted by a device under test. Thus, the received signals have to be amplified by a very high amplification factor. By arranging a further, second antenna closer to the device under test, the measurement of the signals emitted by the device under test can be improved.

When performing measurements of the device under test, the antenna beam of the device under test may be taken into account. Accordingly, when performing measurements on the first link between the first antenna and the antenna beam of the device under test with respect to first antenna should be comparable with the orientation of the device under test with respect to the second antenna when performing measurements on the second link between the second antenna and the device under test. For this purpose, the device under test can be moved around by means of a mechanical positioning structure.

The mechanical positioning structure may be any kind of structure that can carry the device under test and controllably move the device under test. In particular, the mechanical positioning structure may change the position and/or orientation of the device under test with respect to the first and the second antenna. The mechanical positioning structure may e.g. comprise an electric motor that may rotate the device under test. The mechanical positioning structure may further comprise a mechanical structure that carries the device under test and is coupled to the electric motor to transfer a rotation of the electric motor into a movement of the device under test.

Accordingly, the device under test may be simply rotated along a predetermined axis in order to change the orientation of an antenna beam of the device under test. For example, when establishing a radio-frequency link between the first antenna and the device under test, the device under test may be moved in a direction such as that the main lobe of the device under test is orientated in the direction of the first antenna. Further, when a radio-frequency link between the second antenna and the device under test is established, the device under test may be moved in such a way that the main lobe of the device under test is orientated towards the second antenna. However, it is understood that any other orientation with respect to the first and the second antenna may be also applied when establishing a radio-frequency link between the respective antenna and the device under test.

In a possible embodiment, the test arrangement may comprise a measurement controller that may be communicatively coupled to the mechanical positioning structure. However, it is understood that any other device for controlling the operation of the mechanical positioning structure may be possible, too.

After a value of at least one physical parameter for the first link between the first antenna and the device under test has been determined and further a correspondence value for the physical parameter of the second link between the second antenna and the device under test has been determined, it is possible to compute a relationship between the respective values. For example, a ratio of the value relating to the first link and the value relating to the second link can be computed. Furthermore, it may be also possible to determine a difference between the respective values. However, it is understood that any other appropriate relationship between the values relating to the respective links can be determined.

Furthermore, it may be also possible to determine the value of a physical parameter for the first link between the first antenna and the device under test and subsequently adapt one or more properties on the second link between the second antenna and the device under test to obtain a value of the physical parameter matching the respective value determined for the first link. For example, a received power of a radio frequency signal may be determined for the first link between the first antenna and the device under test. Consequently, a transmission power on the second link between the second antenna and the device under test may be adapted until the receive power of the radio frequency signal on the second link matches the determined value on the first link. In this case, a relationship between the transmission power on the first link and a transmission power on the second link may be determined. It is understood, that a for determining the values on the first link, the device under test is moved to an appropriate position with respect to the first antenna, and for determining the corresponding values on the second link, the device under test is moved to an appropriate position with respect to the second antenna.

After the relationship between the one or more physical parameters on the first and the second link has been computed, it is possible to perform a measurement of the device under test by emitting and/or receiving signals on a link between the device under test and the second antenna. The test parameters, in particular a signal strength, a transmission power, etc., but also signal parameters like an error vector measure (EVM) may be set up for the second transmission link by taking into account the above identified relationship. In this way, a desired measurement conditions for a measurement by means of the first antenna can be scaled to measurement conditions for a measurement by means of the second antenna. Hence, measurement conditions with respect to the first antenna may be re-scaled to measurement conditions with respect to the second antenna. Since the distance between the second antenna and the device under test is smaller than the distance between the first antenna and the device under test, a lower transmission power is required by using the second antenna in order to achieve a same signal strength.

The determination of the values of the physical parameters, the computation of the relationship between the values relating to the first link and the second link, and the measurement procedure, in particular the scaling of the values with respect to the second antenna may be performed by her measurement processor. The measurement processor may be embodied, for example, in the measurement device. The measurement processor may be realized, at least in part, by software. For example, the measurement processor may comprise a CPU and memory comprising instructions which can be carried out by the CPU.

Further embodiments of the present invention are subject of the further subclaims and of the following description, referring to the drawings.

In a possible embodiment, a distance between the device under test and the first antenna or a reflector of the first antenna is larger than a distance between the device under test and the second antenna.

By arranging the second antenna in a distance closer to the device under test and that the distance between the device under test and the first antenna, a lower transmission power for transmitting signals between the device under test and the second antenna is required. Furthermore, it is possible to precisely control the signal quality of the signals emitted by the second antenna at the device under test, if there is only a small distance between the second antenna and the device under test. For example, the distance between the first antenna and the device under test may be 2, 5, 10, 20, 50 or even 100 times the distance between the second antenna and the device under test. Accordingly, a high signal power can be achieved at the device under test by emitting a signal having only a relative low power.

In a possible embodiment, the first antenna is located in a far field distance of the device under test and the second antenna is located in a near field distance of the device under test.

By arranging the second antenna in a near field of the device under test, the second antenna is arranged very close to the device under test. In particular, by adapting the transmission properties of the second antenna based on the acquired physical parameters of the link between the first antenna in a far field distance and the device under test, the second antenna in the near field of the device under test may simulate far field properties.

In a possible embodiment, the first position of the device under test and the second position of the device under test are set with respect to a beam direction of the device under test. Further, the first position of the device under test may be set with respect to the position of the first antenna, and the second position of the device under test may be set with respect to the position of the second antenna.

For example, when establishing the first link between the device under test and the first antenna, the device under test may be moved in such a manner that the main lobe of the device under test is directed towards the first antenna. Accordingly, when establishing the second link between the device under test and the second antenna, the device under test may be moved in such a manner that the main lobe of the device under test is directed towards the second antenna. However, any other orientation of the device under test with respect to the respective antenna is also possible. For example, the device under test may be moved in such a manner that the respective antenna is located in predetermined site lobe of the device under test.

In a possible embodiment, the measurement device is adapted to control a beam direction of the device under test.

For example, the device under test may comprise an antenna system comprising a number of more than one antenna elements. In particular, the beam direction of the device under test may be electrically controlled. In such a manner, the device under test may be controlled for changing the beam direction of the device under test during measuring the device under test. In particular, the main lobe of the device under test may be directed towards the first antenna when evaluating the first communication link and the main lobe may be directed towards the second antenna when evaluating the second communication link.

In a possible embodiment, the position of the device under test is set to the second position when performing the measurement of the device under test based on the determined first value and the determined second value.

Accordingly, the measurement procedure can be performed by applying second link between the second antenna and the device under test. In this way, the measurement can be performed by the second antenna which is closer to the device under test, and thus requires lower transmission power. By taking into account in the parameters acquired based on the first link, the measurements according to the second link may be converted with respect to the configuration of the first link. For example, a power ratio of received power on the first link and the second link may be taken into account when evaluating the measurement data. Furthermore, any other kind of data, in particular physical parameters evaluated for the first and the second link may be taken into account for transforming the measurement results of the second link to corresponding data referring to the first link.

In a possible embodiment, the first antenna comprises at least one of an antenna system, a Compact Antenna Test Range (CATR) reflector, or a plane wave converter.

A CATR may e.g. be used to provide convenient testing of antenna systems where obtaining far-field spacing to the device under test would be infeasible using traditional free space methods. The CATR may e.g. use one or more source antennas which may radiate a spherical wavefront and one or more reflectors to collimate the radiated spherical wavefront into a planar wavefront within the desired test zone, i.e. the position of the device under test. However, it is understood that any other antenna or antenna system may be also possible for the first antenna. In particular, any kind of antenna providing and almost homogeneous electromagnetic field in a far field of the respective antenna may be used.

In a possible embodiment, the physical parameter comprises at least on of Error-Vector-Magnitude (EVM), transmitted power, received power. In particular parameters such as Reference Signal Received Power (RSRP), Received Signal Strength Indicator (RSRI) may be used for assessing the physical properties of the respective link.

In a possible embodiment, the measurement device comprises a signal generator for generating test signals and providing the test signals to the first antenna and the second antenna.

The signal generator may be any kind of device for generating radio-frequency signals. For example, the signal generator may provide test signals for evaluating the device under test. Moreover, the signal generator may also provide control signals for controlling the operation of the device under test during the test procedure.

In a possible embodiment, the measurement device may comprise an analyzer for analyzing test signals received by the device under test and/or the second antenna. Furthermore, the analyzer may also analyze signals received by the first antenna.

The signal generator and/or the analyzer may e.g. comprise a signal processor for processing the communication signal to the device under test or the first/second antenna. The communication controller may further comprise any additional elements, like e.g. digital-to-analog converters, analog-to-digital converters, filters, attenuators, amplifiers and the like, that are necessary for performing the communication with the device under test via the first/second antenna.

In a possible embodiment, the test arrangement may comprise a measurement controller that may be communicatively coupled to the mechanical positioning structure and/or the device under test for controlling the position of the device under test and for controlling the test arrangement to simulate a communication between the device under test and the second antenna. In this way it is possible to emulate radio frequency conditions according to a link between the first antenna and the device under test. In particular the measurement controller may take into account a relationship between physical parameters acquired based on the first link and physical parameters acquired based on the second link.

The measurement controller may be a control device, e.g. a control computer that controls, manages or performs the respective test or measurement of the device under test. The measurement controller may e.g. comprise a step-wise description of the test to be performed and execute the single steps one after the other. Such a description may e.g. define at which positions the device under test should be placed and what data should be communicated to the device under test and which signals should be provided to the first/second antenna.

The description may also define properties of the signals that are expected to be measured by the test antenna system. This may allow the measurement controller to verify or qualify the measured signals.

The measurement controller may e.g. comprise a signal processor for processing the communication signal from and to the device under test. The measurement controller may further comprise any additional elements, like e.g. digital-to-analog converters, analog-to-digital converters, filters, attenuators, amplifiers and the like, that are necessary for performing the communication with the device under test via an antenna. The measurement controller may therefore act as or comprise a communication signal generator.

In a possible embodiment, the measurement controller may be communicatively coupled to the first/second antenna for providing the respective antenna with signals to be emitted to the device under test and/or for receiving via the antennas communication signals from the device under test.

The antennas may also emit disturbance or test signals to the device under test. Such signals serve to test the behavior of the device under test, especially the communication to the antennas, under such influences. The measurement controller may therefore also provide such interference or disturbance signals to the antennas, while performing communication with the device under test via the respective antenna.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which:

FIG. 3 shows a block diagram of an embodiment of a test method according to the present invention.

Figure 1:
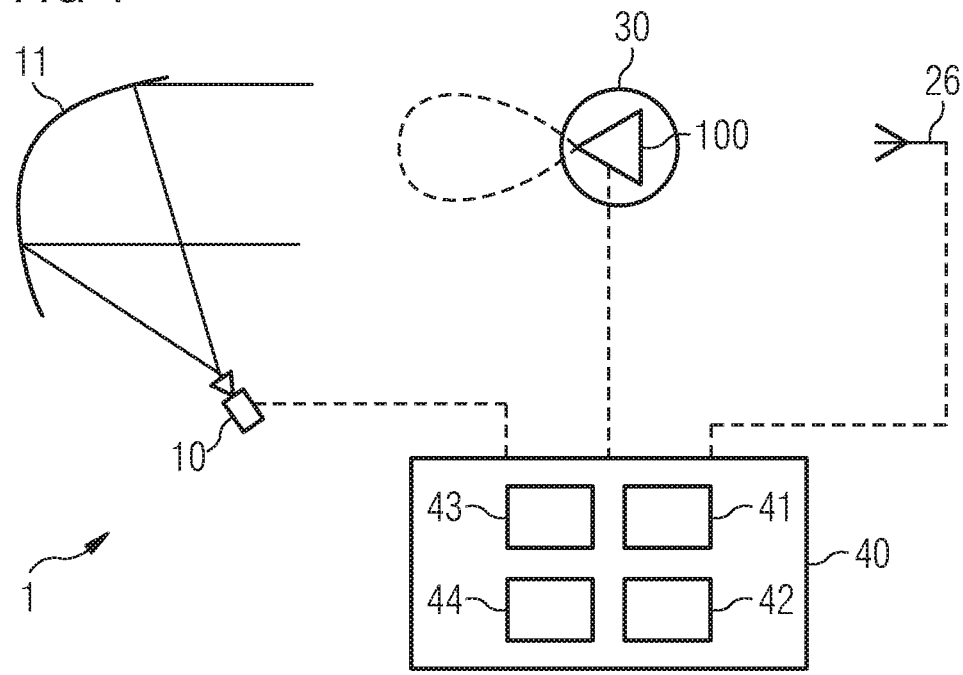
FIG. 1 shows a block diagram of an embodiment of a test arrangement according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a test arrangement 1 for testing a device under test 100. The test arrangement 1 comprises a first antenna 10, a second antenna 20 and a mechanical positioning structure 30. Further, the test arrangement 1 comprises a measurement device 40. Measurement device 40 may comprise a memory 41, a measurement controller 42, a signal generator 43 and/or an analyzer 44.

The first antenna 10 may be arranged at a first spatial position and the second antenna 20 may be arranged at a second spatial position. In particular, a distance between the first antenna 10 and the device under test 100 may be larger than a distance between the second antenna 20 and the device under test 100. For example, the first antenna 10 may be arranged in a far field distance with respect to the device under test 100, and the second antenna 20 may be arranged in a near field distance of the device under test 100. In exemplary embodiment, the distance between the first antenna 10 and the device under test 100 may be 2, 5, 10, 20, 50 or 100 times larger than a distance between the second antenna 20 and the device under test 100. However, it is understood, that any other relationship between the distances with respect to the first and the second antenna 10, 20 may be also possible.

The test antenna 10 may comprise a reflector 11 or the like. For example, antenna 10 may comprise a Compact Antenna Test Range (CATR) reflector, or a plane wave converter. A CATR may e.g. be used to electromagnetic signals where obtaining far-field spacing to the device under test would be infeasible using traditional free space methods. The CATR may e.g. use one or more source antennas which may radiate a spherical wavefront and one or more reflectors to collimate the radiated spherical wavefront into a planar wavefront within the desired test zone, i.e. the position of the device under test. However, it is understood that any other antenna or antenna system may be also possible for the first antenna. In particular, any kind of antenna providing and almost homogeneous electromagnetic field in a far field of the respective antenna may be used. Accordingly, the device under test 100 is provided with an almost homogeneous electromagnetic field based on the signals emitted by the first antenna 10.

In a first step, the first antenna 10 may emit a radio frequency test signal towards the device under test 100. The device under test 100 may receive the signal emitted by the first antenna 10 and determine a first signal strength P1 of the received signal. For example, the device under test 100 may determine a physical parameter corresponding to the received test the signal. Such a physical parameter may be, for example a received power in terms of a Reference Signal Received Power (RSRP), a Received Signal Strength Indicator (RSRI), or the like. Furthermore, it may be also possible to determine any other appropriate physical parameter of the received test signal.

Additionally or alternatively, it may be also possible that the device under test 100 may emit a radio-frequency test signal towards the first antenna 10. In this case, the first antenna 10 may receive the emitted signal and analyze at least one physical parameter of the received signal. Similar to the explanation above, it may be possible to determine a signal strength, in particular a received power of the test signal or the like. However, a determination of any other appropriate parameter may be possible, too.

It is understood, that the determination of physical parameters relating to the link between the device under test 100 and the first antenna 10 is not limited to only a single parameter. Moreover, it may be also possible to determine a number of two or more physical parameters relating to a current transmission of a signal.

In particular, the determination of the one or more physical parameters relating to the transmission of a signal between the first antenna 10 and the device under test 100 may be performed based on a transmission of a signal having predetermined characteristics. For example, a transmission power of the signal may be set to a predetermined value, or any other characteristic parameter of the test signal may be said to a predetermined value.

The one or more physical parameters relating to the transmission of the signal between the first antenna 10 and the device under test 100 may be determined by measurement device 40, and the determined one or more predetermined physical parameter may be stored in a memory 41 of measurement device 40. Furthermore, the process of transmitting the test the signal by the first antenna 10 and/or the device under test 100 and the determination of the physical parameters may be also controlled by the measurement device 40. For example, the operation of the measurement device 40 may be controlled by a measurement controller 42 comprising a processor and a memory for storing instructions executed by the processor.

Figure 2:
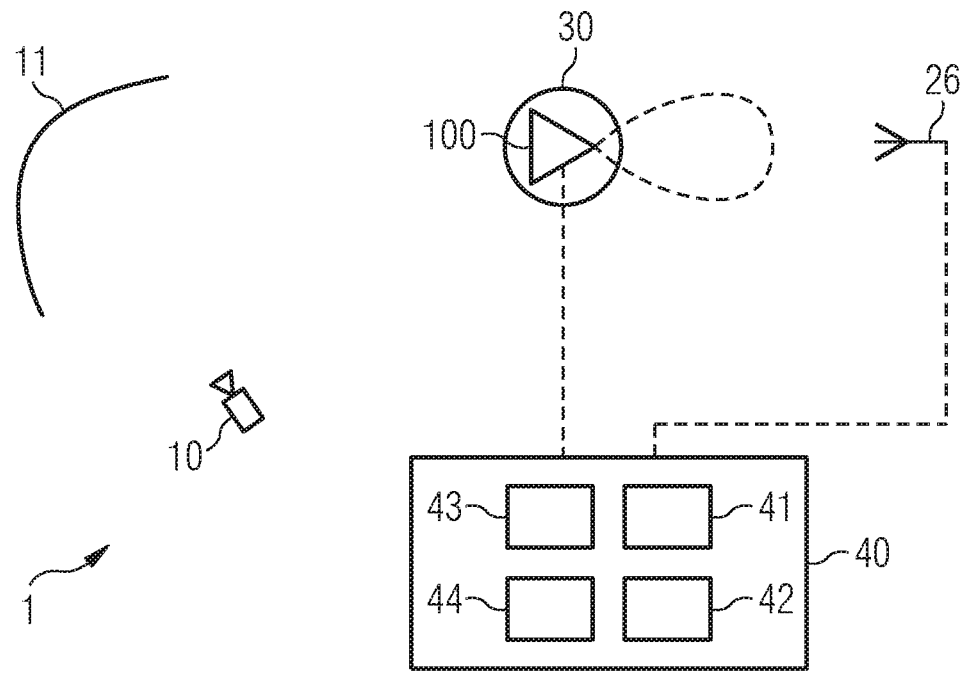
FIG. 2 shows a block diagram of another embodiment of a test arrangement according to the present invention.

After the determination of the physical parameters relating to the transmission between the first antenna 10 and the device under test 100 has been completed, a further determination of corresponding physical parameters is performed for a transmission of a test signal between the second antenna 20 and the device under test 100 as shown in FIG. 2. For this purpose, the position of the device under test 100 may be changed. For example, the device under test 100 may be moved to a position such that an antenna beam of the device under test 100 is oriented with respect to the second antenna 20.

In an example, the antenna beam of the device under test 100 may be directed towards the first antenna 10 when measuring the parameters with respect to the transmission of the test signal between the first antenna 10 and the device under test 100, as shown in FIG. 1. Further, the antenna beam of the device under test 100 may be directed towards the second antenna 20 when measuring the parameters with respect to the transmission of a test signal between the second antenna 20 and device under test 100 as shown in FIG. 2. However, it is understood that any other orientation of the antenna beam of the device under test 100 with respect to the first antenna 10 and the second antenna 20 may be also possible. In particular, an orientation of the antenna beam of device under test 100 with respect to the first antenna 10 when measuring the parameters with respect to the transmission between the first antenna 10 and the device under test 100 may be the same as the orientation with respect to the second antenna 20 when measuring the parameters with respect to a transmission between the second antenna 20 and the device under test 100.

In order to change the orientation/position of the device under test 100 with respect to the first antenna 10 or the second antenna 20, the device under test 100 may be moved by the mechanical positioning structure 30. For example, the mechanical positioning structure 30 may comprise a holding element for fixing the device under test 100 on the mechanical positioning structure 30. For example, the device under test 100 may be fixed on the mechanical positioning structure 30 by means of a clamp, a number of screws, a rubber band or any other appropriate element for fixing the device under test 100.

In particular, the mechanical positioning structure 30 may comprise a plate which can be turned around a predetermined axis in order to change the orientation of the device under test 100 with respect to the first antenna 10 and the second antenna 20. For example, the turnable plate may be moved by means of an electric motor or the like. It may be also possible to fix the device under test 100 on a movable arm or the like and to move the device under test 100 by moving around this arm. For example, the arm may be turned around one or more predetermined axis in order to change the orientation of the device under test 100 with respect to the first antenna 10 and the second antenna 20. Furthermore, it may be also possible to move the device under test 100 along a number of one or more axis in order to adapt the orientation of the device under test 10 with respect to the first antenna 10 and the second antenna 20. However, it is understood, that any other appropriate structure for moving around the device under test 10 and in particular to change the orientation of device under test 100 with respect to the first antenna 10 and the second antenna 100 may be also possible.

After the physical parameter with respect to the transmission between the first antenna 10 and the device under test 100 has been determined, and the orientation/position of the device under test 100 is changed, and a corresponding a transmission of a test signal between the second antenna 20 and the device under test 100 is performed in order to determine corresponding physical parameters for this transmission of a test signal.

For example, a further signal may be transmitted between the second antenna 20 and the device under test 100 having predetermined characteristics such as a predetermined transmission power.

Furthermore, it may be also possible to successively adapt one or more parameters of the signal between the second antenna 20 and the device under test 100 in order to achieve the same or at least a similar physical parameter corresponding to the determined physical parameter with respect to the transmission of a signal between the first antenna 10 and the device under test 100. For example, it may be possible to adapt the transmission power of the signal between the second antenna 20 and the device under test 100 successively upon a Reference Signal Received Power (RSRP) with respect to the transmission of the signal between the second antenna 20 and the device under test 100 is the same then a RSRP which has been determined with respect to the signal between the first antenna 10 and the device under test 100 as determined before.

Based on the values for the one or more physical parameters determined for the first link between the first antenna 10 and the device under test 100 and the second link between the second antenna 20 and device under test 100, it may be possible to compute the relationship between the respective properties of the two links. For example, a ratio between the value of physical parameter relating to the first transmission link and the corresponding a value of the physical parameter relating to the second transmission link can be computed. Alternatively, it may be also possible to determine a difference between the values of the respective physical parameter the basis for the further processing. However, it is understood, that any other measure for characterizing a relationship between the first transmission link and the second transmission link may be also determined.

For example, it may be possible to determine a first RSRP for a transmission of a test signal between the first antenna 10 and the device under test 100, and to determine a second RSRP for a transmission of a test signal between the second antenna 10 and the device under test 100. Accordingly, ratio or a difference between the two RSRP may be computed.

Alternatively, it may be also possible to determine the first RSRP for the transmission of the test signal between the first antenna 10 and the device under test 100 based on a predetermined transmission power. Subsequently, it may be possible to determine a transmission power for transmitting a test signal between the second antenna 20 and the device under test 100 which can achieve a same RSRP. In this case, it may be possible to take into account the difference between the transmission power used for transmitting the first test signal between the first antenna 10 and the device under test 100 and the second transmission power used for transmitting the second test the signal between the second antenna 20 and the device under test 100. However, it may be also possible to take into account the ratio between the two values of the respective transmission powers or any other appropriate measure relating to the respective parameters.

After determining the above described values for the desired physical parameters and computing the relationship between the respective values, a desired measurement operation for testing the device under test 100 may be performed. In particular, the testing of the device under test 100 may be performed by emitting and/or receiving test signals by the second antenna 20. Since the second antenna 20 is located at a closer distance to the device under test 100 than the first antenna 10, it may be possible to perform the measurement with a reduced power of the test signals. Furthermore, the reliability of the test signals between the second antenna 20 and the device under test 100 may be improved with respect to a long-distance transmission between the first antenna 10 and the device under test 100.

For testing the device under test 100, the device under test 100 may be moved to a position/orientation corresponding to the position/orientation used for determining the respective physical parameters of the link between the second antenna 20 and the device under test 100 as described above. Accordingly, the testing of the device under test 100 is performed based on a transmission and/or reception of signals between the device under test 100 and the second antenna 20. The link between the second antenna 20 and the device under test 100 may be uses for a communication with the device under test 100. Furthermore any kind of measurement signals may be provided to the device under test 100 and/or any kind of signals which are emitted by the device under test 100 may be received by the second antenna 20.

In order to simulate radio frequency conditions relating to a test scenario with respect to the first antenna 10, measurement device 40 may take into account the above described computed relationship between the values of the physical parameters with respect to the first antenna 10 and the second antenna 20. Accordingly, the respective properties of a signal between the second antenna 20 and the device under test 10 may be adapted in such a manner that the properties the signal correspond to desired properties with respect to a signal transmission between the first antenna 10 and the device under test 20.

For example, the signal power of the signal emitted by the second antenna 20 may be set to a value which can achieve a desired signal strength at the device under test 100. However, it is understood, that any other property, for example a desired rate, e.g. a desired EMV, it can be achieved.

Accordingly, it is possible to simulate a measurement of the device under test 100 by the first antenna 10, by the measurement using the second antenna 20. For this purpose, the signals emitted by the second antenna 20 are adapted in such a way that the signal properties at the position of the device under test 100 correspond to signal properties which would be caused by signal transmitted by the first antenna 10. Furthermore, the signals received by the second antenna 20 may be re-scaled in such a way that the re-scaled values of the signals correspond to signal properties which would be received by the first antenna 10.

In this way, the testing of the device under test 100 can be performed by a test configuration requiring only small spatial dimensions, namely only in the second antenna 20 and the device under test 100. Such a configuration and can be even arranged indoor. For example, the device under test 100 and the second antenna 20 may be arranged in a test chamber or the like.

Furthermore, since the link antenna 20 is arranged very close to the device under test 100, only a very low signal strength is required. Thus, the test arrangement 1 only has to provide low power signals which can be provided by a simple and low-cost hardware.

For sake of clarity in the following description of the method based FIG. 3 the reference signs used above in the description of apparatus based FIGS. 1 and 2 will be maintained.

FIG. 3 shows a block diagram of a test method for testing a device under test. The test method comprises emitting (S1) signals by a first antenna 10 to the device under test 100 or measuring signals emitted by the device under test 100 to the first antenna 10. In step S2 a first value of a physical parameter on a first communication link between the device under test 100 and the first antenna 10 by a measurement device 40 is determined. The method further comprises controllably moving (S3) the device under test 100 by a mechanical positioning structure 30 that carries the device under test 100. In step S4 signals are emitted by a second antenna 20 for to the device under test 100 or measuring signals emitted by the device under test 100 to the second antenna 20. In a step S5 a second value of a physical parameter on a second communication link between the device under test 100 and the second antenna 20 is determined.

The method further comprises performing (S6) a measurement of the device under test 100 based on the determined first value and the determined second value by the measurement device. In particular the device under test 100 is moved to a first position for determining the first value and the device under test 100 is moved to a second position for determining the second value.

A distance between the device under test 100 and the first antenna 10 or a reflector 11 of the first antenna 10 may be larger than a distance between the device under test 100 and the second antenna 20.

The first antenna 10 may be located in a far field distance of the device under test 100 and the second antenna 20 is located in a near field distance of the device under test 100.

The method may further comprise setting the first position of the device under test 100 and the second position of the device under test 100 with respect to a beam direction of the device under test 100. In particular, the first position may be set with respect to the first antenna 10, and the second position may be set with respect to the second antenna 20.

The method may further comprise controlling a beam direction of the device under test 100.

The device under test 100 may be located a second position for performing the measurement of the device under test 100 based on the determined first value and the determined second value.

The first antenna 10 may comprise at least one of an antenna system, a Compact Antenna Test Range (CATR) reflector, or a plane wave converter.

The physical parameter may comprise at least on of Error-Vector-Magnitude, transmitted power, received power, Reference Signal Received Power, Received Signal Strength Indicator.

The method may further comprise generating test signals and providing the test signals to the first antenna 10 and the second antenna 20 by a signal generator 43.

The method may further comprise analyzing, by a signal analyzer 44, test signals received by the first antenna 10 and by the second antenna 20.

Summarizing, the present invention provides a test arrangement and test method for testing a wireless device under test. A first antenna may be arranged at a first distance from the device under test, and a second antenna may be arranged at a second distance from the device under test. In particular, the second antenna may be arranged closer to the device under test and the first antenna. Physical parameters characterizing the transmission properties between the individual antenna and the device under test are determined for the first and the second antenna. Test of the device under test is performed employing the second antenna, wherein the signals are rescaled based on a ratio between the determined transmission properties.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited for the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A test arrangement for testing a device under test, the test arrangement comprising:
   a first antenna for emitting signals to the device under test or measuring signals emitted by the device under test to the first antenna,
   a second antenna for emitting signals to the device under test or measuring signals emitted by the device under test to the second antenna,
   a mechanical positioning structure that carries the device under test and controllably moves the device under test, and
   measurement device for determining a first value of a physical parameter on a first communication link between the device under test and the first antenna, determining a second value of a physical parameter on a second communication link between the device under test and the second antenna, and for performing a measurement of the device under test based on the determined first value and the determined second value,
   wherein the device under test is moved to a first position for determining the first value and the device under test is moved to a second position for determining the second value, and
   wherein the first antenna is located in a far field distance of the device under test and the second antenna is located in a rear field distance of the device under test.

2. The test arrangement according to claim 1, wherein the first position of the device under test and the second position of the device under test are set with respect to a beam direction of the device under test.

3. The test arrangement according to claim 1, wherein the measurement device is adapted to control a beam direction of the device under test.

4. The test arrangement according to claim 1, wherein the device under test is located at a second position when performing the measurement of the device under test based on the determined first value and the determined second value.

5. The test arrangement according to claim 1, wherein the first antenna comprises at least one of an antenna system, a Compact Antenna Test Range (CATR) reflector, or a plane wave converter.

6. The test arrangement according to claim 1, wherein the physical parameter comprises at least on of Error-Vector-Magnitude, transmitted power, received power.

7. The test arrangement according to claim 1, wherein the measurement device comprises a signal generator for generating test signals and providing the test signals to the first antenna and the second antenna.

8. The test arrangement according to claim 1, wherein the measurement device comprises a signal analyzer for analyzing test signals received by the first antenna and by the second antenna.

9. A test method for testing a device under test, the test method comprising:
   emitting signals by a first antenna to the device under test or measuring signals emitted by the device under test to the first antenna,
   determining a first value of a physical parameter on a first communication link between the device under test and the first antenna by a measurement device, controllably moving the device under test by a mechanical positioning structure that carries the device under test,
emitting signals by a second antenna for to the device under test or measuring signals emitted by the device under test to the second antenna,
determining a second value of a physical parameter on a second communication link between the device under test and the second antenna, and
performing a measurement of the device under test based on the determined first value and the determined second value by the measurement device,
wherein the device under test is moved to a first position for determining the first value and the device under test is moved to a second position for determining the second value, and
wherein the first antenna is located in a far field distance of the device under test and the second antenna is located in a near field distance of the device under test.

10. The test method according to claim 9, comprising setting the first position of the device under test and the second position of the device under test with respect to a beam direction of the device under test.

11. The test method according to claim 9, further comprising controlling a beam direction of the device under test.

12. The test method according to claim 9, wherein the device under test is located a second position for performing the measurement of the device under test based on the determined first value and the determined second value.

13. The test method according to claim 9, wherein the first antenna comprises at least one of an antenna system, a Compact Antenna Test Range (CATR) reflector, or a plane wave converter.

14. The test method according to claim 9, wherein the physical parameter comprises at least on of Error-Vector-Magnitude, transmitted power, received power, Reference Signal Received Power, Received Signal Strength Indicator.

15. The test method according to claim 9, comprising generating test signals and providing the test signals to the first antenna and the second antenna by a signal generator.

16. The test method according to claim 9, comprising analyzing, by a signal analyzer, test signals received by the first antenna and by the second antenna.

* * * * *

UNITED STATES PATENT AND TRADEMARK OFFICE
CERTIFICATE OF CORRECTION

PATENT NO. : 10,768,216 B2
APPLICATION NO. : 15/921912
DATED : September 8, 2020
INVENTOR(S) : Vincent Abadie et al.

It is certified that error appears in the above-identified patent and that said Letters Patent is hereby corrected as shown below:

In the Claims

Column 14, Claim 1, Line 32, please replace the word "rear" with the word --near--.

Signed and Sealed this
Nineteenth Day of April, 2022

Katherine Kelly Vidal
*Director of the United States Patent and Trademark Office*